United States Patent [19]

Lal et al.

[11] Patent Number: 5,324,593

[45] Date of Patent: Jun. 28, 1994

[54] THIN FILM MEDIUM WITH LAYERED FILM GRADIENT

[75] Inventors: Brij B. Lal, San Jose; Atef H. Eltoukhy, Saratoga, both of Calif.

[73] Assignee: HMT Technology Corporation, Fremont, Calif.

[21] Appl. No.: 837,855

[22] Filed: Feb. 18, 1992

[51] Int. Cl.$^5$ ............................ B32B 5/14; H01F 1/00
[52] U.S. Cl. .................................... 428/610; 428/611; 428/668; 428/634; 428/928
[58] Field of Search ............... 428/610, 611, 668, 614, 428/694, 928, 678, 662, 660, 670, 680, 663, 634

[56] References Cited

U.S. PATENT DOCUMENTS

| 4,259,392 | 3/1981 | Suzuki . | |
| 4,636,448 | 1/1987 | Morita et al. | 428/611 |
| 4,798,765 | 1/1989 | Ishizaka et al. | 428/611 |
| 4,929,514 | 5/1990 | Natarajan et al. | 428/611 |
| 4,988,578 | 1/1991 | Yamashita et al. . | |
| 5,162,158 | 11/1992 | Christner et al. | 428/667 |

OTHER PUBLICATIONS

Chen, T., et al., "The Effect of Orientation, Grain Size and Polymorphism on Magnetic Properties of Sputtered Co-Re Thin Film Media," IEEE Trans. Magnetics *MAG-17(6)*:3187-3189 (1981).
Chen, T., and Yamashita, T., "Physical Origin of Limits in the Performance of Thin-Film Longitudinal Recording Media," IEEE Trans. Magnetics 24(6):2700-2705 (1988).
Chen, T., and Charlan, G.B., "High coercivity and high hysteresis loop squareness of sputtered Co-Re thin film," J. Appl. Phys. 50(6):4285-4291 (1979).
Pressesky, J., et al., "Crystallography and magnetic properties of CoCrTa films prepared on Cr underlayers with different substrate bias conditions," J. Appl. Phys. 69(8):5163-5165 (1991).
Sanders, I. L., et al., "Magnetic and Recording Characteristics of Very Thin Metal-Film Media," IEEE Trans. Magnetics 25(5):3869-3871 (1989).
Yamashita, T., et al., "Sputtered Ni$_x$P Underlayer for CoPt-Based Thin Film Magnetic Media," IEEE Trans. Magnetics 27(6):4727 (1991).
Yogi, T., et al., "Role of atomic mass of underlayer material in the transition noise of longitudinal media," J. Appl. Phys. 69(8):4749 (1991).
Yogi, T., et al., "Longitudinal Media for 1 Gb/in$^2$ Areal Density," IEEE Trans. Magnetics 26(5):2271-2276 (1990).
Zhu, J.-G., and Bertram, H. N., "Micromagnetic studies of thin metallic films (invited)," J. Appl. Phys. 63(8):3248-3253 (1988).

*Primary Examiner*—Benjamin R. Fuller
*Assistant Examiner*—Valerie Ann Lund
*Attorney, Agent, or Firm*—Peter J. Dehlinger

[57] ABSTRACT

A magnetic thin-film disc having a magnetic thin film formed of a lower and upper sublayers. The two sublayers are characterized by lower coercivity, smaller grains, and more isolated grains in the lower sublayer, and higher coercivity, and larger grains in the upper sublayer. In one embodiment, the sublayers are characterized by an increasing magnetic remanence on progressing from the outer to the inner diameter of the disc. Also disclosed are sputtering methods for producing the disc.

5 Claims, 5 Drawing Sheets

THIN FILM MEDIUM WITH LAYERED FILM GRADIENT

FIELD OF THE INVENTION

The present invention relates to a thin-film magnetic disc having a magnetic thin-film layer gradient, in layer thickness and preferably in magnetic remanence, on progressing from inner- to outer-diameter regions of the disc.

BACKGROUND OF THE INVENTION

Thin-film hard disc magnetic media are widely used for on-line data storage in couplers. In recent years, considerable effort has been spent in achieving higher recording density. Among the most important factors in this recording density are:

(1) Magnetic remanence, which is a measure of the signal amplitude which can be read from an isolated pulse stored in the medium-the greater the remanence, or moment, the greater the signal amplitude which can be detected in a reading operation.

(2) Coercivity, defined as the magnetic field required to reduce the remanence magnetic flux to 0, i.e., the field required to erase a stored bit of information. Higher coercivity in a medium allows adjacent recorded bits to be placed more closely together without mutual cancellation. Thus, higher coercivity is associated with higher information storage density.

(3) Signal/noise ratio, defined as the ratio of the power of a given signal to the noise power in a given bandwidth, and provides a measure of signal amplitude relative to noise level. The higher the S/N ratio, the greater the bit density which can be read with a given degree of reliability.

(4) Overwrite, defined as the effectiveness in erasing a signal read at one frequency with a higher frequency signal. Overwrite provides a measure of the residual signal which remains after overwrite by a new signal.

(5) Flying height, i.e., the distance which a read/write head floats above the spinning disc. Less overlaps of voltage signals in adjacent magnetic domains in the disc occurs as the read/write head is moved closer to the disc surface, allowing recording density to be increased. The flying height is limited principally by surface irregularities in the disc. For a thin-film medium formed on standard aluminum substrate, the minimum flying height is about 3 microinch. Flying heights as low as 1-2 microinch can be achieved in a thin-film medium formed on more perfect-surface substrate, such as a glass substrate.

In addition, it is now a common feature in hard disc systems to vary the read-write sampling frequency according to the radial position of the read-write head on the disc. In particular, the sampling frequency is increased, in progressing toward the outer-diameter region of the disc, to maintain a substantially constant linear bit density. Thus, for example, if the linear disc speed at the outer disc diameter is twice that at the inner diameter, the sampling frequency should also be twice as great at the outer diameter region to give the same linear density of bits at both inner- and outer-diameter regions. This greater sampling frequency results in a higher signal output and higher noise at the outer diameter of the disc.

At the same time, the overwrite characteristics in a thin-film medium tend to suffer at the outer diameter region of a thin-film medium. This is because of the higher recording frequency and because the head flying height, which depends on planing effects, increases with the greater disc linear velocity on moving toward the outer diameter region of the disc. Thus, a flying height of 6 micro-inches at the inner disc diameter can result in a 12 micro-inch flying height at the outer disc diameter. The greater flying height at the outer-diameter region, along with the higher recording frequency, reduces the ability of the head flux to saturate the magnetic domains in the magnetic layer, thus reducing overwrite characteristics.

In summary, radial-position effects due to differences in sampling rate and flying height at different radial positions on a disc can significantly effect the performance characteristics of the disc, particularly S/N ratio and overwrite, imposing different bit density limitations at both the inner- and outer-diameter regions of the disc.

SUMMARY OF THE INVENTION

In one aspect, the invention includes a magnetic thin-film medium having (a) a disc-like substrate, (b) a sputtered underlayer formed on the substrate surface, (c) a sputtered magnetic thin-film layer composed of a lower and upper sublayers characterized by lower coercivity, smaller grains, and more isolated grains in the lower sublayer, and higher coercivity, larger grains, and more grain overlap in the upper sublayer, and (d) a protective overcoat formed on the thin-film layer.

In one embodiment, the sputtered underlayer is a chromium underlayer having a thickness between about 1,000 and 3,000 Å, the two sublayers each have a thickness between about 100–400 Å, and each region of the upper sublayer has substantially the same cobalt-based alloy composition as the underlying region of the lower sublayer. The lower and upper sublayers are preferably formed by sputtering a cobalt based alloy from a target onto the chromium underlayer at higher and lower sputtering pressures, respectively.

In one embodiment, at least one of the sublayers is characterized by increasing magnetic remanence $M_r$ on progressing from the inner to the outer diameter of the disc. This embodiment is preferably composed of an alloy containing Co and at least one of the elements Cr, Ta, V, W, B, Zr, Si, Hf, P, and has an increasing amount of Pt and/or Ni on progressing from the inner- to the outer-surface diameter.

At least one of the sublayers may also have an increasing thickness on progressing from the outer to the inner diameter of the disc.

In another aspect, the invention includes a method of forming a layered magnetic thin-film layer on a disc-like substrate. The method includes sputtering magnetic alloy material from a target onto the surface, at one selected sputtering pressure, to form a lower sublayer on the underlayer, and then sputtering magnetic alloy material from a target onto the lower sublayer, at a different selected sputtering pressure, to form an upper sublayer which has a higher coercivity, larger grain size, and more grain overlap than does the lower sublayer.

In a preferred method, the lower and upper sublayers are formed by sputtering from the same target, and the sputtering pressure used in forming the lower sublayer is above about 15 mTorr, and the sputtering pressure used in forming the upper sublayer is less than about 10 mTorr.

In one embodiment of the method, the target used in forming the sublayers on the disc includes inner and outer coaxial annular portions. These inner and outer potions are composed of an alloy containing Co and at least one of the elements Cr, Ta, V, W, B, Zr, Si, Hf, P, and the outer portion additionally contains Pt and/or Ni, to produce an increasing Pt and/or Ni concentration in the sublayers on progressing toward the outer diameter of the disc.

These and other objects and features of the present invention will become more fully apparent when the following detailed description of the invention is read in conjunction with the accompanying drawings.

DETAILED DESCRIPTION OF THE INVENTION

I. Thin-Film Medium

Figure 1:
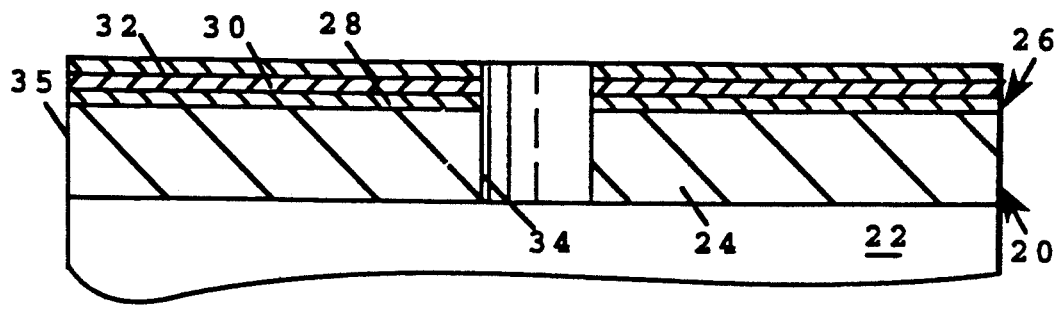
FIG. 1 is a cross-sectional view of a thin-film magnetic disc formed in accordance with the present invention.

FIG. 1 shows in cross sectional view, a fragmentary portion of a thin-film medium or disc 20 formed in accordance with one embodiment of the present invention. The disc generally includes a rigid substrate 22, and forming successive thin-film layers over the substrate, a sputtered layer, such as a crystalline underlayer 24 or a nickel-containing alloy, which is sputtered directly onto the substrate, a magnetic thin-film layer 26 composed of lower and upper sublayers 28, 30, respectively, and a protective carbon overcoat 32.

The substrate may be a textured substrate, such as a conventional surface-coated, textured aluminum substrate of the type used commonly for digital recording medium. Typically, the substrate is first plated with a selected alloy plating, such as a nickel/phosphorus plating, to achieve a requisite surface hardness, with the thickness of the plating being about 300-700 microinches. Alternatively, the substrate may be a textured glass or ceramic substrate, such as described in co-owned patent application for "Glass Substrate with Controlled Low-Friction Surface," Ser. No. 475,715, filed Feb. 20, 1990.

Two conventional size substrates have outer diameters of 130 or 95 mm, with corresponding inner diameters of 40 and 25 mm, respectively. The inner and outer edges of the disc which define these diameters are indicated at 34, 35, respectively, in FIG. 1.

The crystalline underlayer is preferably a sputtered chromium underlayer having a thickness between about 300-3,000 Å. High coercivity, remanence and loop squareness values are achieved particularly at an underlayer thickness of between about 1,000-3,000 Å. Chromium-containing alloys, such as CrV, CrGd and CrSi, may also be suitable, as may a tungsten underlayer.

According to an important feature of the invention, the lower and upper sublayers in the magnetic thin film are characterized by lower coercivity, smaller grains, and more isolated grains in the lower sublayer, and higher coercivity, larger grains, and more grain overlap in the upper sublayer. The more isolated grains in the lower sublayer leads to reduced noise and a higher signal-to-noise ratio (SNR) as will be seen below. Methods of forming the lower and upper sputtered sublayers are discussed above.

The magnetic layer in the FIG. 1 embodiment has a preferred magnetic-film thickness between about 400 to 800 Å. The lower sublayer typically accounts for between about 10%-70% of the total sublayer, and has a preferred thickness between about 100-400 Å. The relative thicknesses of the two sublayers can be selected to optimize the signal-to-noise ratio at the inner-diameter region of the disc, as discussed below.

In the embodiment shown, the two sublayers are composed of the same magnetic alloy, preferably a Co-based magnetic alloy. Typically, the alloy will contain Co and or more of the elements Ni, Pt, Cr, Ta, V, W, B, Zr, Si, Hf, P. In one embodiment, the alloy forming the magnetic layer at the inner diameter of the disc is composed of 70-85 atom percent cobalt, 5-20 atom percent chromium, and 2-10 atom percent tantalum. A specific example is an alloy containing Co/Cr/Ta at an atom ratio of 84.5:12.5:3. In another embodiment, the alloy contains in addition, to Co, Cr, and Ta, an amount of Pt, B, and/or Ni which amparts a higher magnetic remanence $M_r$ to the sublayer. One specific example contains 70-85 atom percent cobalt, 5-20 atom percent chromium, 2-15 atom percent platinum, and 2-10 atom percent tantalum.

The carbon overcoat in the thin-film medium is preferably a carbon layer formed by sputtering carbon onto the magnetic layer, under conditions in which the carbon is in a predominantly $sp_2$, diamond-like structure. The overcoat thickness is preferably between 250 and 500 Å.

Figure 2:
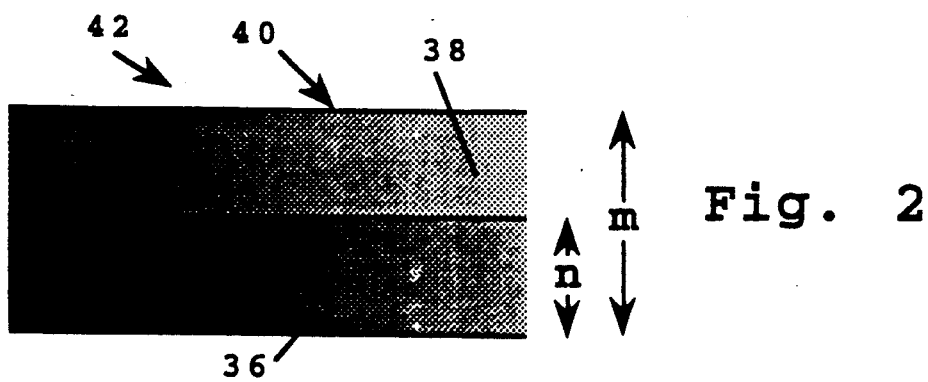
FIG. 2 shows cross-sectional portions of two sublayers in a thin-film magnetic disc formed in accordance with another embodiment of the invention.

FIG. 2 shows portions of lower and upper sublayers 36, 38 which form a magnetic thin film layer 40 in a thin-film medium 42 formed in accordance with a second general embodiment of the invention. The lower and upper sublayers in the magnetic thin film are characterized by lower coercivity, smaller grains, and more isolated grains in the lower sublayer, and higher coercivity, larger grains, and ore grain overlap in the upper sublayer, as above. Layer 40 and lower sublayer 36 have thicknesses indicated at m and n, respectively, in FIG. 2. In addition, at least one, and preferably both of the sublayers are characterized by increasing magnetic remanence $M_r$ on progressing from the inner to the outer diameter of the disc, as indicated by the shading gradient in the figure. The gradient sublayer(s) is preferably formed of a cobalt-based alloy, such as the Co/Cr/Ta alloy described above, but additionally contains increasing amount of Pt and/or Ni on progressing from the inner- to the outer-surface diameter. Methods for forming a two-sublayer film layer with a magnetic remanence gradient in at least one of the sublayers is described below.

Figure 3:
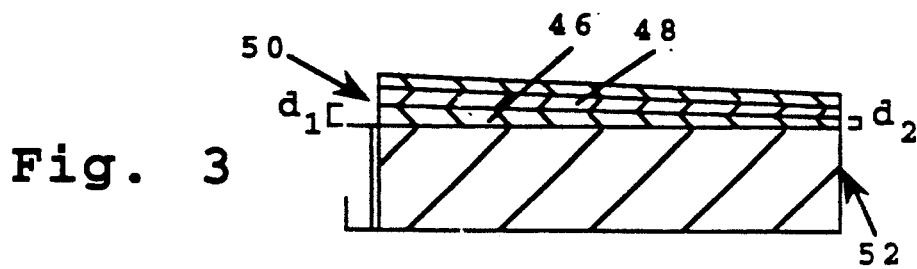
FIG. 3 is a cross-sectional view of a portion of a thin-film magnetic disc formed in accordance with a third embodiment of the invention.

FIG. 3 portions of lower and upper sublayers 46, 48 which form a magnetic thin film layer 50 in a thin-film medium 52 formed in accordance with a third general embodiment of the invention. As in the first two embodiments, the lower and upper sublayers in the magnetic thin film are characterized by lower coercivity, smaller grains, and more isolated grains in the lower sublayer, and higher coercivity, larger grains, and more grain overlap in the upper sublayer. In addition, at least one and preferably both sublayers, are characterized by a greater thickness on progressing from disc's outer to inner diameters. The thickness gradient is indicated in FIG. 3 for sublayer 46 where d1 represents the inner diameter thickness and d2 represents the outer diameter thickness. The one or more sublayers with a thickness gradient may also be characterized by a magnetic remanence gradient, as above. Methods for forming a two-sublayer film layer with a thickness gradient in at least one of the sublayers is described below.

II. Method of Producing the Medium

Figure 4:
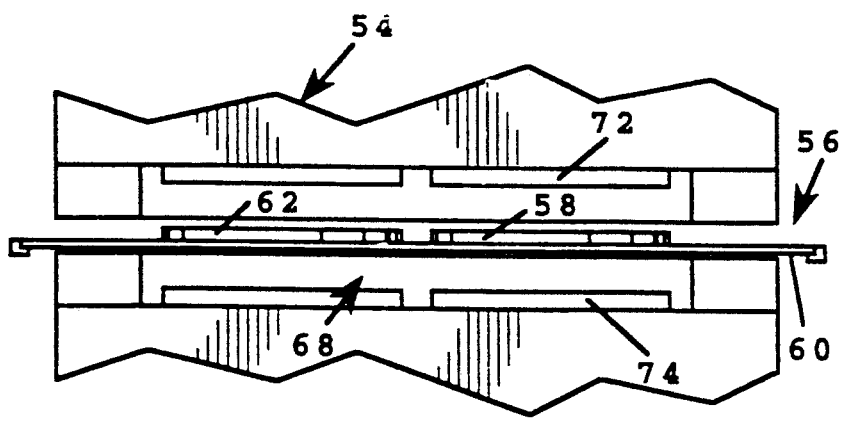
FIG. 4 is a schematic sectional view of a sputtering station in a sputtering apparatus used in producing the thin-film medium of the invention.

FIG. 4 shows, in schematic view, a portion of a sputtering apparatus 54 which is used, in the method of the invention, for producing the thin-film medium described in Section I. The apparatus includes a vacuum chamber 56 having at least four stations at which sputtering or heating operations occur. A heating station (not shown) at the upstream end of the chamber has a plurality of infrared lights which are arrayed for heating both sides of a substrate, such as substrate 58, carried through the station in the chamber on a disc holder 60. In the apparatus illustrated, two substrates, such as substrates 58, 62, are carried side-by-side on the disc holder for movement through the apparatus on a conveyor.

Downstream of the heating station are three sputtering stations at which are sputtered (1) the chromium underlayer, (2) the two sublayers forming the magnetic thin film, and (3) the carbon overlayer. FIG. 4 shows a schematic front-on view of the second sputtering station, indicated generally 68, at which the two sublayers of the magnetic film are formed. The station includes, for each substrate carried through the station, a pair of annular targets, such target 72, 74, each effective to sputter a selected magnetic alloy onto the chromium sublayer sputtered over the substrate. Station 68 is representative of the sputtering stations in the apparatus.

The basic sputtering apparatus is preferably a commercial system, such as in available from Varian/Intevac (Santa Clara, Calif.), Circuits Processing Apparatus (Fremont, Calif.), ULVAC (Japan), Leybald Heraeus (Germany), VACTEC (Boulder, Colo.), or Materials Research Corporation (Albany, N.Y.). These systems are double-sided, in-line, high-throughput machines having two interlocking systems, for loading and unloading.

In operation, the sputtering chamber is evacuated to pressure of about $10^{-7}$ Torr, and argon gas is introduced into the chamber to a final sputtering pressure of 5–40 mTorr. The substrate is heated in the heating station to a selected temperature before advancing into the three sputtering chambers. The heating conditions in the apparatus are preferably adjusted to achieve a substrate temperature of between about 200° C., and preferably about 270° C. Ceramic and glass substrates can be heated up to 380° C. In particular, in forming the lower sublayer, where the higher sputtering pressure leads to lower coercivity, the coercivity of the sublayer can be increased by sputtering onto a higher-temperature substrate.

Table 1 below shows the amount of additional preheating needed to achieve a selected coercivity, as a function of percent lower sublayer. The lower sublayer was sputtered at 20 mTorr, and the upper sublayer, at 6 mTorr. As seen, a greater degree of preheating is required as the percent lower sublayer increases from 0 to 100% of total magnetic-film thickness. The data show that the two-sublayer structure allows less preheating, for a given coercivity, than a film formed entirely at the higher sputtering pressure.

TABLE 1

| % n-Layer Thickness (20 mTorr) | Substrate Pre-Heating Power.Time Kw.Sec. | % Increase |
|---|---|---|
| 0* | 24.44 | 0 |
| 0.33 | 25.70 | 5 |
| 0.50 | 27.1 | 10 |
| 0.75 | 28.11 | 15 |
| 1 | 28.86 | 18 |

*Sputtered at 6 mTorr

The heated substrate is moved into the first sputtering chamber, and the chromium underlayer is sputtered onto the textured disc surface under which in the deposition layer (110) crystal plane is predominantly the plane of the substrate. That is, the chromium layer has a high anisotropic parallel/perpendicular crystal orientation ratio. This anisotropy is important in establishing desired magnetic layer crystal orientation during formation of the magnetic layer in the parallel c-axis direction, which in turn, is requisite for achieving high coercivity in longitudinal reading. Sputtering voltage and deposition rates which favor (110) crystal plane formation are known to those skilled in the art.

The underlayer thickness may be selected, in the present invention, to achieve desired magnetic properties in the thin-film medium of the invention. Studies carried out with Co/Cr/Ta/Pt magnetic thin film media, and reported in co-owned U.S. Pat. No. 5,049,451, indicate that highest coercivity and resolution will be achieved at underlayer thicknesses between about 1,000 to 3,000 Å. The underlayer thickness is controlled by conventional sputter deposition parameters, such as sputter pressure, target power, voltage, deposition time, etc. These parameters are adjusted, conventionally, to achieve the desired underlayer thickness.

After formation of the underlayer, the substrate is moved downstream on a disc holder into the second sputtering chamber, where the magnetic layer is sputtered onto the underlayer. For producing the embodiment of the invention illustrated in FIG. 1, the target in this sputtering station is composed of a single alloy, such as an alloy containing 70-85 atom percent cobalt, 5-20 atom percent chromium, and 2-10 atom percent tantalum, or one containing 70-85 atom percent cobalt, 5-20 atom percent chromium, 2-15 atom percent platinum, and 2-10 atom percent tantalum, as described above.

According to an important feature of the invention, the lower and upper sublayers are formed under sputtering conditions which lead to smaller grains and more isolated grains (and inherently lower coercivity) in the lower sublayer, and larger grains, and more grain overlap in the upper sublayer, as well as higher coercivity. In one method, the lower sublayer is formed at a sputtering pressure greater than about 10 mTorr, and preferably between about 15-40 mTorr, and the upper sublayer, at a sputtering pressure below 10 mTorr, and preferably between about 3-8 mTorr.

Figure 5:
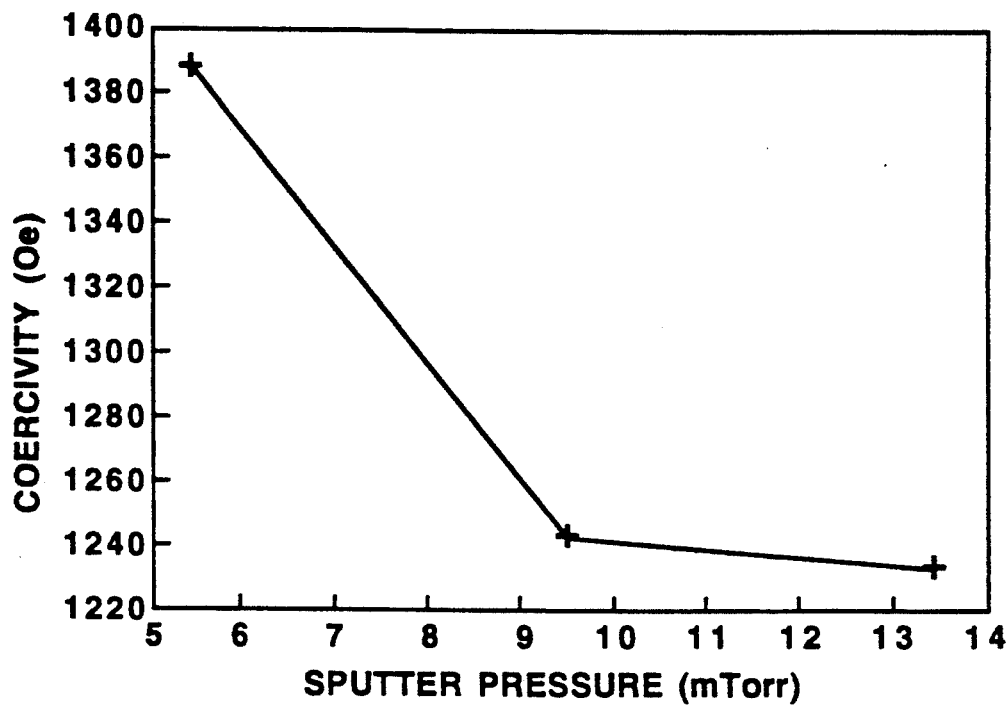
FIG. 5 is a plot of coercivity in a disk with a sputtered Co/Cr/Ta magnetic thin film, as a function of sputter pressure.

FIG. 5 shows the change in measured coercivity in a Co/Cr/Ta magnetic film sputtered to a thickness of 500 Å at sputtering pressures between 6-13.5 mTorr. As seen, there is a sharp drop in coercivity below about 9-10 mTorr, indicative of smaller grain size and less grain overlap at the higher sputtering pressure.

The lower sublayer is sputtered to a final thickness preferably between about 100-500 Å, and the upper sublayer, to a final magnetic layer thickness (the combined sublayer thicknesses) preferably between about 200-800 Å. The relative thicknesses of the two sublayers is preferably selected to optimize the signal amplitude and SNR characteristics of the medium at the disc's inner diameter, and the overwrite characteristics at disc's outer diameter. As will be seen below, highest SNR at the ID generally occurs typically in the range of lower sublayer thickness between about 30-70 percent of total magnetic film thickness. These values are also consistent with good overwrite characteristics at the disc's OD. In one exemplary sputtering operation, the chamber is brought to chamber pressure of about 20 mTorr, by introduction of argon gas. After sputtering the lower sublayer to a selected thickness, e.g., 200 Å, the chamber is changed to pressure of about 6 mTorr, and the upper sublayer is sputtered to achieve a final magnetic layer thickness of about 400-500 Å.

Figure 6:
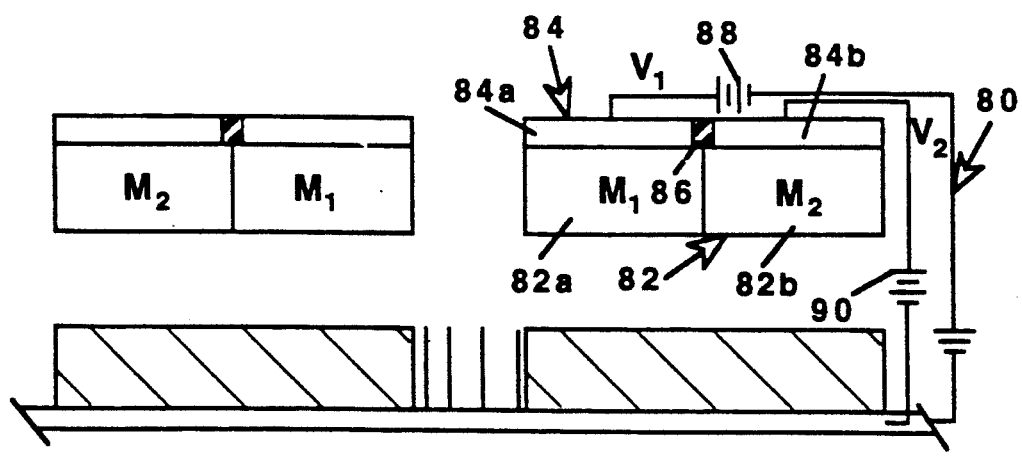
FIG. 6 is a schematic sectional view of another embodiment of a target configuration in a sputtering station of the type shown in FIG. 4.

FIG. 6 illustrates a modified sputtering configuration for use in producing a sublayered magnetic thin film which also has a radial gradient of increased magnetic remanence on progressing toward the outer diameter of the disc, as illustrated in FIG. 2. The sputtering configuration, indicated generally at 80, employs a coaxial, two-alloy annular target 82 composed on an inner, annular target portion 82a, and an outer annular target portion 82b. Preferably the inner target portion is composed of a cobalt-based indicated at M1, such as described above, and the outer target portion is composed of the same alloy, but additionally containing 2 to 20 atom percent Pt and/or Ni, as indicated at M2. In one preferred embodiment, one alloy forming the inner target portion is composed of Co/Cr/Ta, in an atom percent ratios given above, and the alloy forming the outer target portion is composed of Co/Cr/Ta/Pt, also in an atom percent ratios given above.

With continued reference to FIG. 6, the target is mounted on a plate 84 which itself is composed of two annular plate portions 84a, 84b which support the corresponding inner and outer portions of target 82, respectively, and which are separated by an insulating ring 86. The two plate portions are connected to separate DC power supplies, indicated at 88, 90, for applying voltages V1 and V2 between the respective target portions and the substrate.

The applied power and/or voltages are adjusted to produce the desired flux of sputtered material from the inner target portion onto the substrate. For producing a uniform-thickness sublayer, such as illustrated in FIG. 2, the voltages are adjusted to apply substantially the same power to each target portion. In a typical example, the DC voltage applied across the two target portions and substrate is between 300 and 700 volts.

The deposition pattern of material from the two-alloy target just described on a substrate is illustrated in the two-sublayer film 40 in FIG. 2. Deposition in the inner annular region (the right side in FIG. 2) occurs predominantly from target portion 82a, and thus will reflect the alloy composition of this inner portion of the target. Similarly, deposition in the outer annular region (the left side in FIG. 2) occurs predominantly from target portion 82b, and thus will reflect the alloy composition of this outer portion of the target.

For producing a sublayered magnetic film in which one or both of the sublayers have a thickness gradient in the radial direction, as illustrated in the disc embodiment shown in FIG. 3, the voltage applied to the inner target portion, which is intended to produce a higher target flux, is typically 300 to 700 volts higher than that applied to the outer target portion.

As indicated above, the lower and upper sublayers are sputtered to relative thicknesses which favor high SNR at the ID region of the disc, and good overwrite at the OD region of the disc. At the same time, it is desired to achieve high coercivity at both regions of the disc.

Figure 7A:
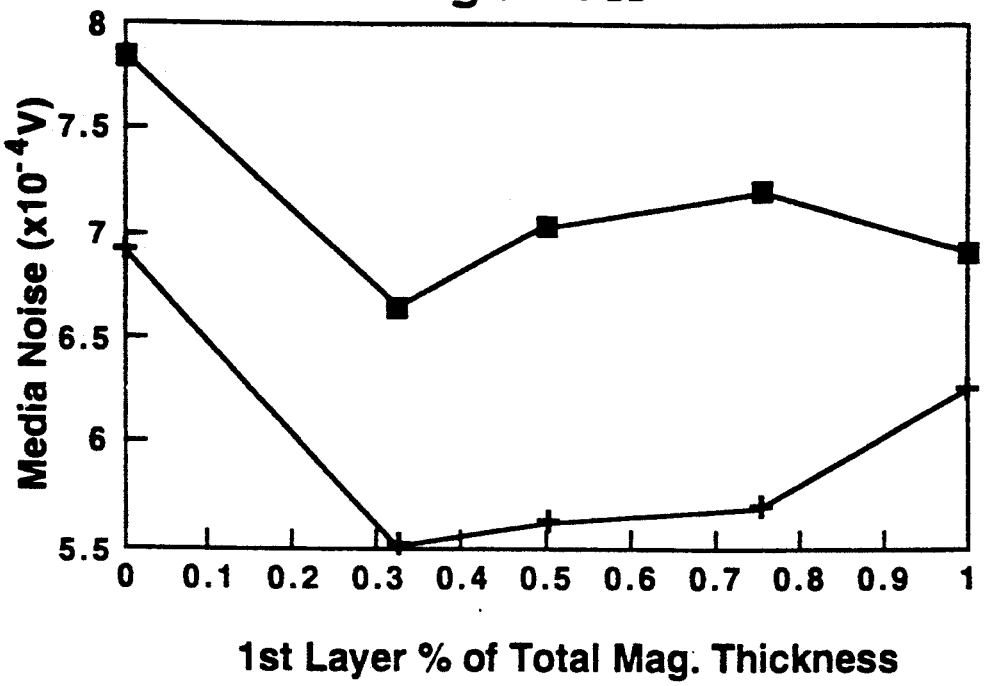
FIGS. 7A and 7B are plots of media noise (7A) and signal-to-noise ratio (SNR) (7B) measured at the inner diameter region of a medium with a sputtered magnetic film composed of a Co/Cr/Ta/Pt alloy (solid rectangles) or two-alloy gradient (crosses)
Figure 7B:
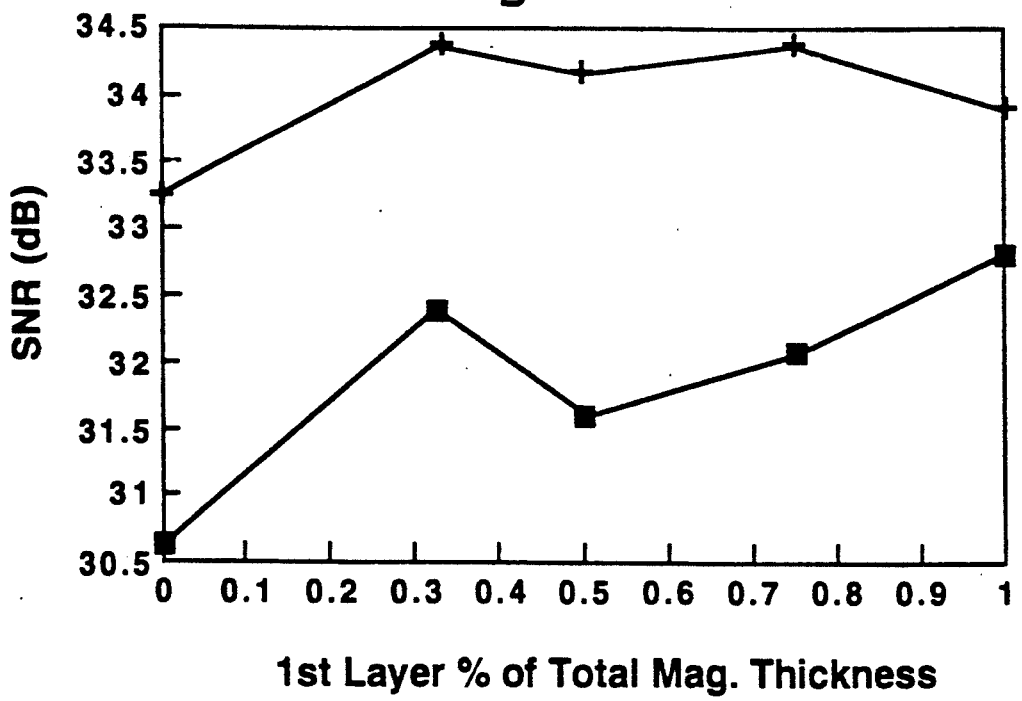

FIGS. 7A and 7B show the variation in media noise and SNR as a function of percent thickness of the lower sublayer, measured at ID (radius: 0.837 inch) The solid rectangle plots in the figures are measured noise and SNR, respectively, in a two-sublayer disc formed with a single alloy composed of Co/Cr/Ta/Pt, at atom ratios of 80:10:3:7. The magnetic film has the uniform composition in the two sublayers described with respect to the FIG. 1 disc. As seen, noise is reduced appreciably between about 30%-70% lower sublayer thickness, and this is reflected by a generally higher ID SNR in the disc (FIG. 7B).

The plots indicated by the "+" symbols are for sublayers formed with a gradient alloy composition, of the type described with respect to FIG. 2. The inner alloy, i.e., the alloy which predominates in the ID region of the disc is a Co/Cr/Ta alloy having atom ratios of 84.5:12.5:3, an alloy characterized by relatively low magnetization and low media noise. The outer alloy is a Co/Cr/Ta/Pt alloy with atom ratios of 80:10:3:7, and characterized by good overwrite, and high magnetization and noise.

As seen in FIG. 7A, ID media noise is minimized at a lower sublayer thickness between 30-70 percent total layer thickness. This is reflected by the high ID SNR of the disc at in this range (FIG. 7B). Moreover, the SNR ratio in the gradient alloy is substantially higher, at the same sublayer thicknesses, than that of the single-alloy layer.

Figure 8A:
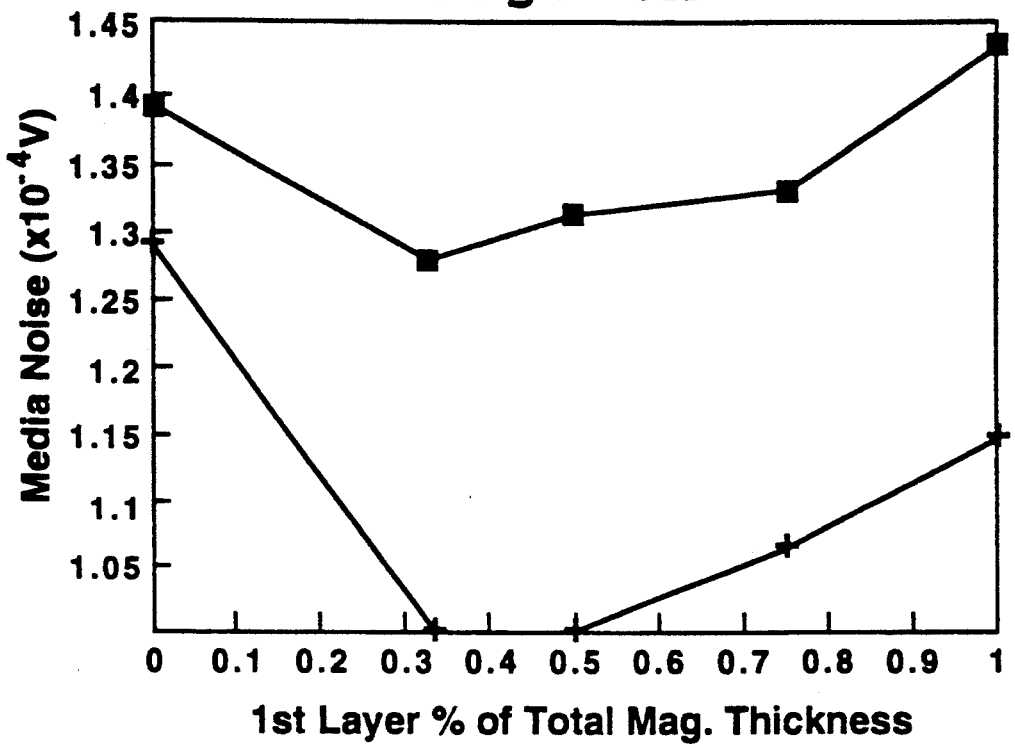
FIGS. 8A and 8B are plots of media noise (SA) and signal-to-noise ratio (SNR) (SB) measured at the outer diameter region of a medium with a sputtered magnetic film composed of a Co/Cr/Ta/Pt alloy (solid rectangles) or two-alloy gradient (crosses)
Figure 8B:
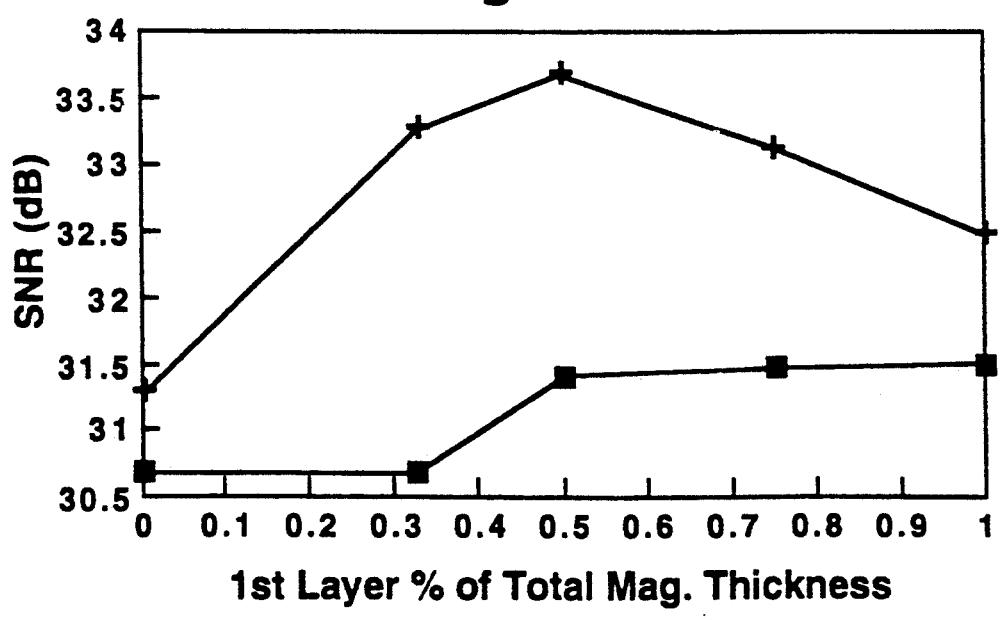

FIGS. 8A and 8B show media noise and SNR ratios, as a function of percent lower sublayer thickness, measured at disc OD (radius: 1.768 inch) region for the same media. For the single-alloy disc, the OD SNR shows a slight increase in SNR between about 40-50% lower sublayer. The OD SNR for the gradient alloy shows a peak at about 50% lower sublayer thickness, but even this peak is well below the corresponding SNR value for the gradient alloy at the ID.

Since one advantageous property of a thin-film medium is high SNR at the ID region, it is desirable to select a percent lower sublayer thickness of about 30-70%. Moreover, SNR values at the ID region can be improved substantially by employing an alloy gradient having an increasing percentage of Pt and/or Ni on progressing away from the ID region.

Figure 9:
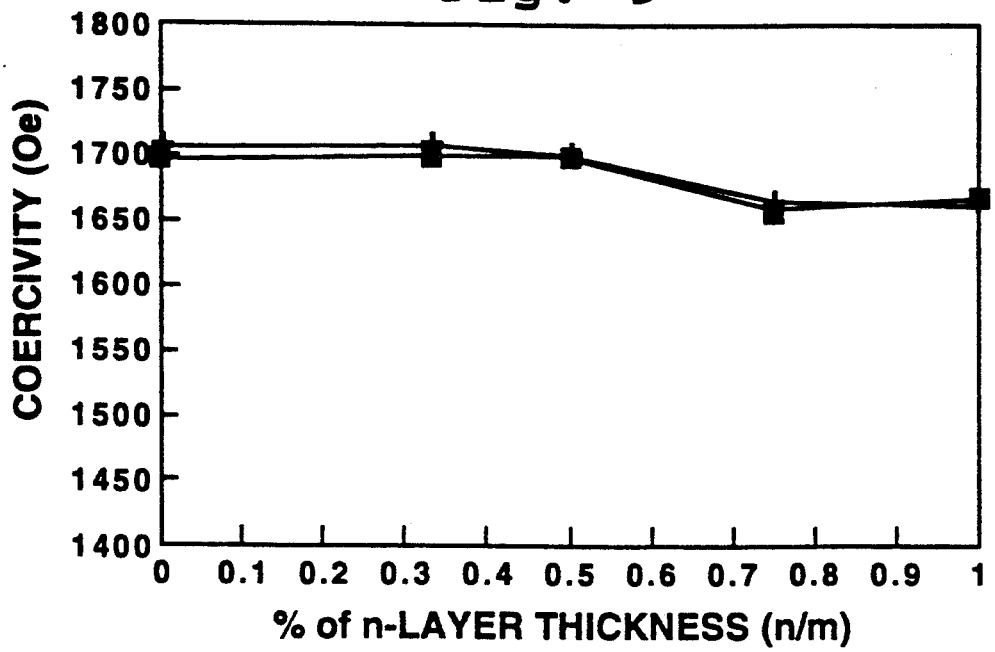
FIG. 9 is a plot of coercivity as a function of relative sublayer thicknesses, in a two-sublayer magnetic thin film formed by sputtering a Co/Cr/Ta/Pt alloy (solid rectangles) or a two-alloy gradient (crosses)

FIG. 9 shows the variation in coercivity with percent lower sublayer thickness, for both the single-alloy (solid rectangles) and gradient-alloy ("+") symbols film compositions. Coercivity values are similar for both alloy compositions, and both show about a 5% drop in coercivity above a 50% lower sublayer thickness. The attempt was made to keep the coercivity about 1700±50 Oe by adjusting substrate temperature.

Based on the foregoing, a preferred magnetic thin-film layer has a percent lower sublayer thickness of about 30-50% of the total magnetic layer thickness. This thickness range allows high SNR characteristics at the disc's ID region, and relatively high coercivity.

III. Properties of the Magnetic Thin-Film Medium

Figure 10:
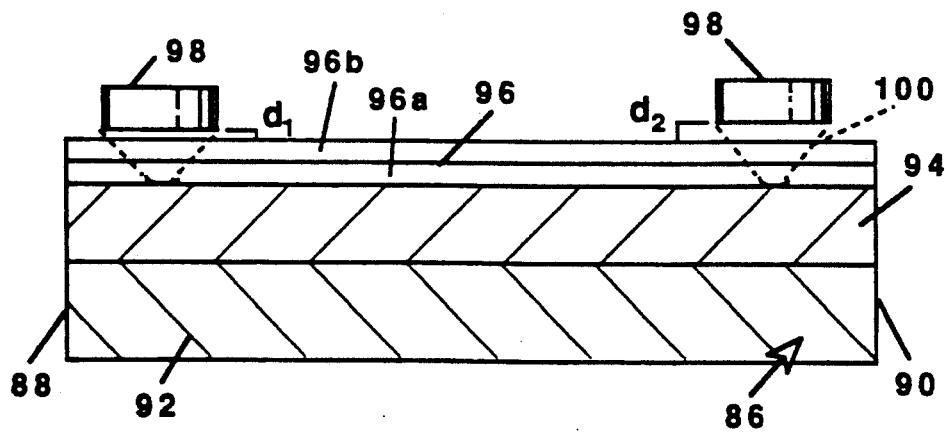
FIG. 10 illustrates how the 2-sublayer disc construction of the present invention functions to improve overwrite characteristics in the OD portion of a disc.

Considering now the properties of the disc, reference is made first to FIG. 10 which shows the "right" side of a disc 86, extending from an inner-diameter 88 to an outer diameter 90. As detailed above, the disc is composed of a substrate 92, a chromium underlayer 94, and a magnetic layer 96 composed of lower and upper sublayers 96a, 96b, respectively. The protective overlayer in the disc is not shown.

The figure illustrates the interaction with the disc magnetic layer of a Winchester-type read/write head 98 as the head flies over the surface of a disc at inner-diameter (left in the figure) or outer-diameter (right in the figure) positions. The effective fringe field of the head, which is the field effective to write data to the disc, is indicated by dotted lines 100 in the figure.

At the inner diameter region, the head flies over the surface of the disc at a flying height $d_1$ which typically is between about 4-8 microns, but which may be as low as 1-3 microns in certain types of glass or ceramic substrates. The fringe field is effective to penetrate the thickness of the two sublayers, and thus minimize residual magnetization in layer, producing good overwrite properties.

At the outer-diameter region, the head flying height $d_2$ will be substantially greater than $d_1$ because of the higher linear velocity of the disc. Because of the greater flying height, the lower sublayer in the magnetic layer in particular will see a smaller magnetic flux density, as shown. However, because of the lower coercivity of the lower sublayer, the head flux density needed to overwrite a signal is reduced. Thus, the head flux is matched to the magnetic layer, being greater in the region of higher coercivity, and less in the lower-coercivity region. This matched configuration leads to improved flux saturation and overwrite in the OD region of the disc.

In a preferred embodiment, the magnetic layer of the disc further includes an alloy-composition gradient which contributes to the performance properties of the disc. As noted above, the alloy gradient may be formed by sputtering from a two-alloy target—one alloy corresponding to the desired alloy composition at the disc's inner diameter, and the other target alloy corresponding to the desired alloy composition at the disc's outer diameter.

Two assess the performance characteristics of magnetic media constructed in accordance with the invention, four thin-film media were prepared. Two of the media had single alloy (Co/Cr/Ta/Pt) magnetic layers formed either as a single 400 Å layer sputtered at 6 mTorr, or as a 200 Å sublayer formed at 20 mTorr and a 200 Å sublayer formed at 6 mTorr. The other two discs were similarly formed as single-layer of equal-thickness sublayers, but composed of a gradient alloy having the above-described Co/Cr/Ta and Co/Cr/Ta/Pt gradient.

Magnetic recording testing was carried out on a Guzik Model RWA 501, using a thin-film inductive reading and recording head with a gap length of 14 $\mu$in., a gap width of 472 $\mu$in., and a flying height of 4.5 $\mu$in. The head inductance was 1.1 $\mu$Henry and resistance, 30 ohms. Recording current was 25-30 mAmps for saturation. Recording frequency was at 7.17 MHz at the disc's inner diameter and 14.64 MHz at the disc's outer diameter, these frequencies corresponding to the normal operating head read-write frequencies of a disc having inner and outer diameters of 25 mm and 95 mm, respectively.

Table 2 shows the HF signal amplitude, measured in $\mu$V, signal-to-noise ratios (SNR), measured in dB, and overwrite (OW), measured in −dB for the four media determined as above at 1.768 inches (OD) at 14.64 MHz.

TABLE 2

| Coercivity ($O_e$) | % n-layer thickness (20 mTorr) | Magnetic Gradient Alloy Media | | | CoCrTaPt-Alloy Media | | |
|---|---|---|---|---|---|---|---|
| | | HF ($\mu$v) | OW (−db) | SNR (dB) | HF ($\mu$v) | OW (−db) | SNR (db) |
| 1700 | 0 | 265 | 20 | 31.3 | 265 | 19.2 | 30.7 |
| 1700 | 0.5 | 266 | 22.4 | 33.7 | 269 | 22.1 | 31.4 |

The HF signal amplitudes of the four discs at OD were nearly identical, showing that the two-sublayer construction gradient is effective in maintaining high signal amplitude values, both with a single-alloy or alloy gradient composition.

One of the desired properties at a disc OD region is good overwrite, and this is achieved in the present invention by the flux matching feature discussed above. In both the single-alloy and gradient composition, an improvement in overwrite of 2-3 dB was achieved with the two-sublayer construction.

Similarly, a significant enhancement in SNR ratio in the OD region was in the two-sublayer construction, with highest values being attained in the gradient alloy.

Table 3 shows the HF signal amplitude, SNR, and OW for the four media determined as above at 0.837 inches (ID) at 7.17 MHz.

TABLE 3

| Coercivity ($O_e$) | % n-layer thickness (20 mTorr) | Magnetic Gradient Alloy Media | | | CoCrTaPt-Alloy Media | | |
| --- | --- | --- | --- | --- | --- | --- | --- |
| | | HF ($\mu v$) | OW (−db) | SNR (dB) | HF ($\mu v$) | OW (−db) | SNR (db) |
| 1700 | 0 | 220 | 30.5 | 33.2 | 210 | 32 | 30.6 |
| 1700 | 0.5 | 227 | 31.4 | 34.2 | 218 | 31.7 | 31.6 |

As discussed above, an important feature of the present invention is improved SNR at the ID region. This is seen from the data in Table 3. For both single-alloy and gradient alloy media, the two-sublayer construction enhanced SNR by about 1 dB.

From the foregoing, it can be appreciated how various objects and features of the invention are met. The two-sublayer construction enhances SNR at the ID region of the disc, where recording density is highest, thus improving recording density in this region. At the same time, the flux matching which occurs at the OD region, where the recording head is flying higher above the disc surface, improves overwrite in this region, also increasing recording density in this region.

Although the invention has been described with respect to particular embodiments, it will be apparent to those skilled in the art that various changes and modifications can be made without departing from the invention.

It is claimed:

1. A magnetic thin-film medium comprising:
   disc-like substrate having an annular surface defined by inner diameter and an outer diameter,
   a sputtered underlayer formed on the substrate surface,
   a sputtered magnetic thin-film layer composed of a lower sublayer and an upper sublayer characterized by lower coercivity, smaller grains and more isolated grains in the upper sublayer, and higher coercivity and larger grains, in the upper sublayer, where at least one of the lower sublayer and upper sublayer is characterized by increasing magnetic remanence $M_r$ on progressing from the inner diameter to the outer diameter of the disc, and
   a protective overcoat formed on the thin-film layer.

2. The medium of claim 1, wherein the sublayer or sublayers in the magnetic thin film layer having the magnetic remanence gradient is formed of an alloy containing Co and at least one element selected from the group consisting of Cr, Ta, V, W, B, Zr, Si, Hf, P, and has an increasing amount of at least one of a component selected from a second group consisting of Pt and Ni, on progressing from the inner diameter to the outer diameter.

3. The medium of claim 2, wherein at least one of the lower sublayer and upper sublayer has an increasing thickness on progressing from the outer diameter to the inner diameter of the disc.

4. A magnetic thin-film medium comprising:
   disc-like substrate having an annular surface defined by inner diameter and an outer diameter,
   a sputtered underlayer formed on the substrate surface,
   a sputtered magnetic thin-film layer composed of a lower sublayer and an upper sublayer characterized by lower coercivity, smaller grains and more isolated grains in the upper sublayer, and higher coercivity and larger grains, in the upper sublayer, where at least one of the lower sublayer and upper sublayer is characterized by increasing thickness on progressing from the outer diameter to the inner diameter of the disc, and
   a protective overcoat formed on the thin-film layer.

5. The medium of claim 4, wherein the lower sublayer and upper sublayer of the magnetic thin film have a combined thickness between about 200 to 700 Å adjacent the disc's inner diameter, and a combined thickness between about 250 and 550 Å adjacent to disc's outer diameter, and a difference in layer thickness between the inner diameter and outer diameter is between about 150 and 300 Å.

* * * * *